United States Patent
Cheng et al.

(10) Patent No.: US 10,431,540 B1
(45) Date of Patent: Oct. 1, 2019

(54) METAL-OXIDE-METAL CAPACITOR WITH REDUCED PARASITIC CAPACITANCE

(71) Applicant: QUALCOMM Incorporated, San Diego, CA (US)

(72) Inventors: Haitao Cheng, San Diego, CA (US); Chao Song, San Diego, CA (US); Ye Lu, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/039,213

(22) Filed: Jul. 18, 2018

(51) Int. Cl.
| | |
|---|---|
| *H01L 21/02* | (2006.01) |
| *H01L 23/522* | (2006.01) |
| *H03F 3/195* | (2006.01) |
| *H01L 49/02* | (2006.01) |
| *H01L 23/66* | (2006.01) |

(52) U.S. Cl.
CPC ...... *H01L 23/5225* (2013.01); *H01L 23/5223* (2013.01); *H01L 23/66* (2013.01); *H01L 28/40* (2013.01); *H03F 3/195* (2013.01); *H01L 2223/6677* (2013.01); *H03F 2200/451* (2013.01)

(58) Field of Classification Search
CPC . H01L 23/5225; H01L 23/5223; H01L 23/66; H01L 2223/6677; H01L 28/40; H03F 3/195; H03F 2200/451

USPC .......................................................... 257/532
See application file for complete search history.

(56) References Cited

U.S. PATENT DOCUMENTS

| | | | |
|---|---|---|---|
| 9,741,687 | B2 | 8/2017 | Shih |
| 2004/0100835 | A1* | 5/2004 | Sugibayashi ........... G11C 11/16 365/200 |
| 2013/0249055 | A1 | 9/2013 | Yang |
| 2017/0263569 | A1* | 9/2017 | Sommer ................ H01L 23/552 |
| 2018/0240797 | A1* | 8/2018 | Yokoyama .......... H01L 21/3205 |

FOREIGN PATENT DOCUMENTS

| | | |
|---|---|---|
| CN | 105575959 A | 5/2016 |
| JP | 2008130683 A | 6/2008 |
| JP | 2015002247 A | 1/2015 |

* cited by examiner

*Primary Examiner* — Tu-Tu V Ho
(74) *Attorney, Agent, or Firm* — Qualcomm Incorporated/Seyfarth Shaw LLP

(57) ABSTRACT

A semiconductor device reduces parasitic capacitance between a metal-oxide-metal (MOM)/metal-insulator-metal (MIM) capacitors and a semiconductor substrate. The semiconductor device includes the semiconductor substrate (e.g., a silicon substrate, a III-V compound semiconductor substrate, or a silicon on insulator (SOI) substrate), a magnetic material layer, and a capacitor. The magnetic material layer is between the semiconductor substrate and the capacitor.

15 Claims, 9 Drawing Sheets

METAL-OXIDE-METAL CAPACITOR WITH REDUCED PARASITIC CAPACITANCE

BACKGROUND

Field

Aspects of the present disclosure relate to semiconductor devices and, more particularly, to metal-oxide-metal (MOM) capacitors with reduced parasitic capacitance.

Background

Mobile radio frequency (RF) chips (e.g., mobile RF transceivers) have migrated to a deep sub-micron process node due to cost and power consumption considerations. Designing mobile RF transceivers is further complicated by added circuit functions for supporting communication enhancements, such as carrier aggregation. Further design challenges for mobile RF transceivers include using passive devices, which directly affect analog/RF performance considerations, including mismatch, noise, and other performance considerations.

Analog integrated circuits use various types of passive devices, such as integrated capacitors. These integrated capacitors may include metal-oxide-semiconductor (MOS) capacitors, p-n junction capacitors, metal-insulator-metal (MIM) capacitors, poly-to-poly capacitors, metal-oxide-metal (MOM) capacitors, and other like capacitor structures. MOM capacitors are also known as vertical parallel plate (VPP) capacitors, natural vertical capacitors (NVCAP), lateral flux capacitors, comb capacitors, as well as interdigitated finger capacitors. MOM capacitors exhibit beneficial characteristics including high capacitance density, low parasitic capacitance, superior RF characteristics, and good matching characteristics without additional masks or process steps relative to other capacitor structures. MOM capacitor structures realize capacitance by using the fringing capacitance produced by sets of interdigitated fingers. For example, MOM capacitors harness lateral capacitive coupling between plates formed by metallization layers and wiring traces.

To increase the capacitance per unit area, MOM capacitors often use capacitance in a vertical direction of multi-layer wiring, and further, use capacitance from wiring layers closer to a substrate. Accordingly, MOM capacitors generate parasitic capacitance related to the substrate, which degrades performance of MOM capacitors.

SUMMARY

A semiconductor device may include a semiconductor substrate, a capacitor and a magnetic material layer. The magnetic material layer is between the semiconductor substrate and the capacitor.

A method of making a semiconductor device may include forming a semiconductor substrate. The method may further include forming a capacitor. The method also includes forming a magnetic material layer between the semiconductor substrate and the capacitor.

A radio frequency (RF) front end module includes a semiconductor device having a semiconductor substrate, a capacitor, and a magnetic material layer between the semiconductor substrate and the capacitor. The RF front end also has an antenna coupled to the semiconductor device.

This has outlined, rather broadly, the features and technical advantages of the present disclosure in order that the detailed description that follows may be better understood. Additional features and advantages of the present disclosure will be described below. It should be appreciated by those skilled in the art that this present disclosure may be readily utilized as a basis for modifying or designing other structures for carrying out the same purposes of the present disclosure. It should also be realized by those skilled in the art that such equivalent constructions do not depart from the teachings of the present disclosure as set forth in the appended claims. The novel features, which are believed to be characteristic of the present disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Figure 1:
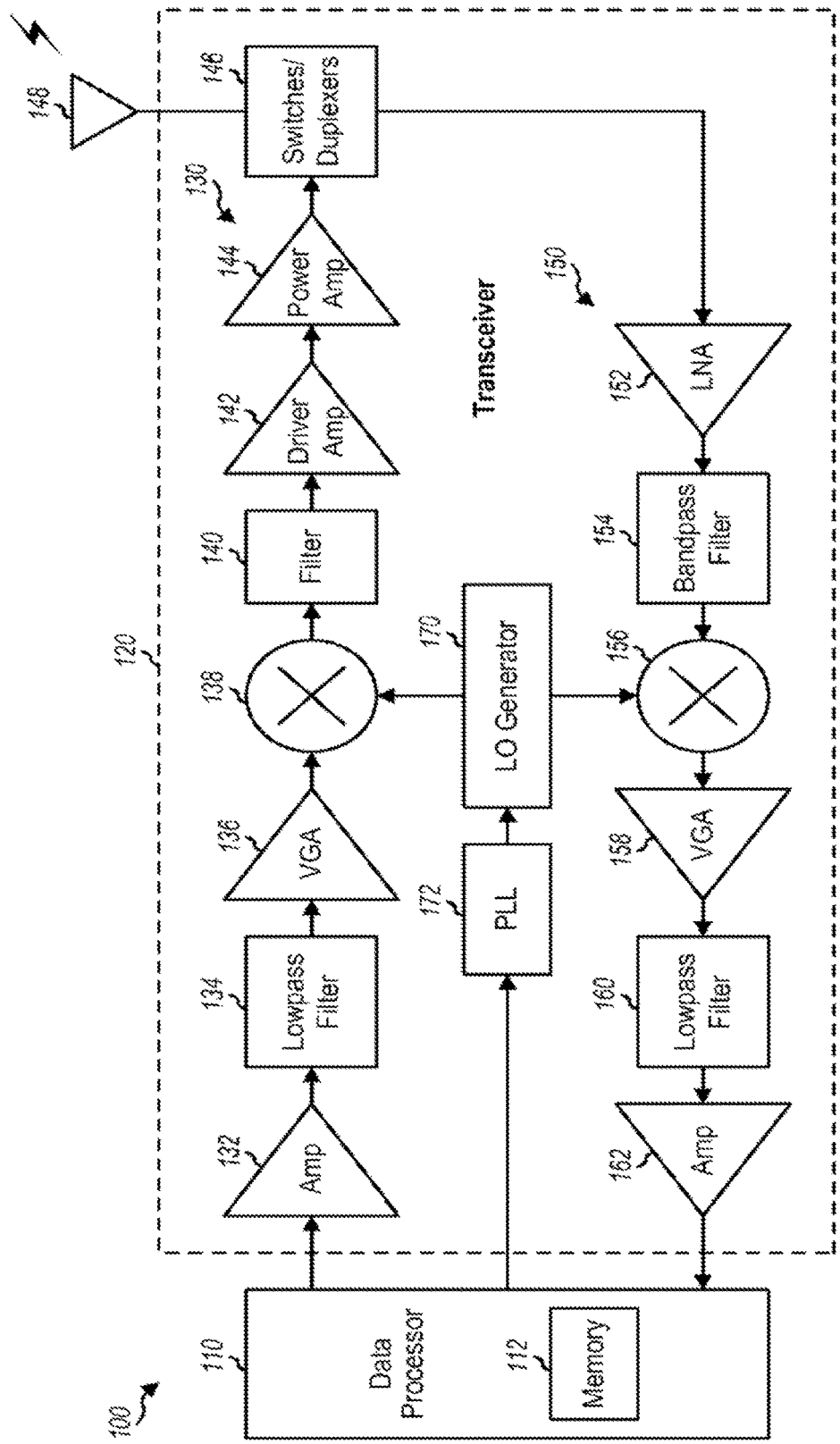
FIG. 1 shows a block diagram of a wireless communication device.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent, however, to those skilled in the art that these concepts may be practiced without these specific details. In some instances, well-known structures and components are shown in block diagram form in order to avoid obscuring such concepts.

As described herein, the use of the term "and/or" is intended to represent an "inclusive OR," and the use of the term "or" is intended to represent an "exclusive OR." As described herein, the term "exemplary" used throughout this description means "serving as an example, instance, or illustration," and should not necessarily be construed as preferred or advantageous over other exemplary configurations. As described herein, the term "coupled" used throughout this description means "connected, whether directly or indirectly through intervening connections (e.g., a switch), electrical, mechanical, or otherwise," and is not necessarily limited to physical connections. Additionally, the connections can be such that the objects are permanently connected or releasably connected. The connections can be through switches. As described herein, the term "proximate" used throughout this description means "adjacent, very near, next to, or close to." As described herein, the term "on" used throughout this description means "directly on" in some configurations, and "indirectly on" in other configurations.

Passive devices in mobile RF transceivers may include high performance capacitor components, such as integrated capacitors. For example, analog integrated circuits use various types of passive devices. These integrated capacitors may include metal-oxide-semiconductor (MOS) capacitors, p-n junction capacitors, metal-insulator-metal (MIM) capacitors, poly-to-poly capacitors, metal-oxide-metal (MOM) capacitors, and other like capacitor structures. Capacitors are generally passive elements used in integrated circuits for storing an electrical charge. For example, parallel plate capacitors are often made using plates or structures that are conductive with an insulating material between the plates. The amount of storage, or capacitance, for a given capacitor is contingent upon the materials used to make the plates and the insulator, the area of the plates, and the spacing between the plates. The insulating material is often a dielectric material.

MOM capacitors are one of the most widely used capacitors due to their beneficial characteristics. In particular, MOM capacitors are used for providing high quality capacitors in semiconductor processes without incurring the cost of an extra processing step relative to other capacitor structures. MOM capacitor structures realize capacitance by using the fringing capacitance produced by sets of interdigitated fingers. For example, MOM capacitors harness lateral capacitive coupling between plates formed by metallization layers and wiring traces.

Another structure employed to increase capacitance is a metal-insulator-metal (MIM) capacitor. In its simplest configuration, a number of horizontal parallel plates of metal are stacked into several layers, separated by dielectrics. The plates are conductive and alternately coupled to form opposite electrodes of a capacitor. The vertical stack of plates is simple to construct, and offers more capacitance per unit area than two conductive surfaces alone.

The process flow for fabrication of capacitors may include front-end-of-line (FEOL) processes, middle-of-line (MOL) processes, and back-end-of-line (BEOL) processes. As described, the back-end-of-line interconnect layers may refer to the conductive interconnect layers (e.g., a first interconnect layer or metal one (M1), metal two (M2), metal three (M3), metal four (M4), etc.) for electrically coupling to front-end-of-line active devices of an integrated circuit. The various back-end-of-line interconnect layers are formed at corresponding back-end-of-line interconnect levels, in which lower back-end-of-line interconnect levels use thinner metal layers relative to upper back-end-of-line interconnect levels.

The back-end-of-line interconnect layers may electrically couple to middle-of-line interconnect layers, for example, connecting the M1 layer to an oxide diffusion (OD) layer of an integrated circuit. The middle-of-line interconnect layer may include a zero interconnect layer (MO) for connecting the M1 layer to an active device layer of an integrated circuit. A back-end-of-line first via (V2) may connect the M2 layer to the M3 layer or others of the back-end-of-line interconnect layers. It will be understood that the term "layer" includes film and is not to be construed as indicating a vertical or horizontal thickness unless otherwise stated. As described, the term "substrate" may refer to a substrate of a diced wafer or may refer to a substrate of a wafer that is not diced. Similarly, the terms "chip" and "die" may be used interchangeably.

Parasitic capacitance formed between the MOM capacitor or the MIM capacitor and a semiconductor substrate (e.g., silicon substrate) degrades performance of the capacitor. The parasitic capacitances are particularly detrimental in resonance circuits with inductors (e.g., inductor-capacitor circuits) where a tuning range is affected by the parasitic capacitance. In some implementations, a magnetic material mitigates parasitic capacitance formed between the MOM capacitor or the MIM capacitor and a semiconductor substrate. A conductive material, however, increases parasitic capacitance, which has a same effect as reducing a distance between a capacitor and a substrate.

Aspects of the present disclosure are directed to a semiconductor device that reduces parasitic capacitance between the MOM/MIM capacitors and the semiconductor substrate. The semiconductor device includes the semiconductor substrate (e.g., a silicon substrate, a III-V compound semiconductor substrate, or a silicon on insulator (SOI) substrate), a magnetic material layer, and a capacitor. The magnetic material layer is between the semiconductor substrate and the capacitor. A dielectric material may be disposed between the magnetic material layer and the capacitor. In one aspect, the magnetic material layer directly contacts the capacitor. In some aspects, the magnetic material may be on the substrate while the capacitor is above the magnetic material. In some implementations, the magnetic material is below or within the semiconductor substrate. For example, part of the substrate is etched and then the magnetic material is deposited.

The magnetic material layer generates a magnetic field that repels charge associated with the capacitor to mitigate (e.g., reduce) parasitic capacitance between a conductive element of the capacitor and the semiconductor substrate. The capacitor may be any type of MOM capacitor (e.g., finger metal-oxide-metal (FMOM), rotated MOM (RT-MOM)), or a MIM capacitor. The magnetic material layer may include a material such as a ferrite or a soft ferromagnetic material. The soft ferromagnetic material may include perm alloy, cobalt-iron (CoFe), cobalt zirconium tantalum (CoZrTa), or cobalt niobium zirconium (CoNbZr). In one aspect, the magnetic material includes a permeability of at least ten (10) Henries/meter (H/m). In one configuration the permeability is 30-1000 (H/m).

The magnetic material may have a footprint that is greater than or equal to a footprint of the capacitor. For example, the magnetic material includes a first surface on the substrate and a second surface opposite the first surface. A perimeter of the capacitor is within a perimeter of the second surface of the magnetic material layer. Alternatively, one or more portions of a surface area of the capacitor overlap the perimeter of the second surface of the magnetic material layer.

FIG. 1 shows a block diagram of an exemplary design of a wireless communication device or wireless communication device 100 that may include the discussed capacitor with reduced parasitic capacitance. In this exemplary design, the wireless communication device 100 includes a data processor 110 and a transceiver 120. The transceiver 120 includes a transmitter 130 and a receiver 150 that support bi-directional wireless communication. In general, the wireless communication device 100 may include any number of transmitters and any number of receivers for any number of communication systems and any number of frequency bands.

In the transmit path, the data processor 110 processes data to be transmitted and provides an analog output signal to the transmitter 130. Within the transmitter 130, the analog output signal is amplified by an amplifier (Amp) 132, filtered by a low pass filter 134 to remove images caused by digital-to-analog conversion, amplified by a VGA 136, and upconverted from baseband to radio frequency (RF) by a mixer 138. The upconverted signal is filtered by a filter 140, further amplified by a driver amplifier 142 and a power amplifier 144, routed through switches/duplexers 146, and transmitted via an antenna 148.

In the receive path, the antenna 148 receives signals from base stations and/or other transmitter stations and provides a received signal, which is routed through the switches/duplexers 146 and provided to the receiver 150. Within the receiver 150, the received signal is amplified by a low noise amplifier (LNA) 152, filtered by a band pass filter 154, and downconverted from RF to baseband by a mixer 156. The downconverted signal is amplified by a VGA 158, filtered by a low pass filter 160, and amplified by an amplifier 162 to obtain an analog input signal, which is provided to the data processor 110.

FIG. 1 shows the transmitter 130 and the receiver 150 implementing a direct-conversion architecture, which frequency converts a signal between RF and baseband in one stage. The transmitter 130 and/or the receiver 150 may also implement a super-heterodyne architecture, which frequency converts a signal between RF and baseband in multiple stages. A local oscillator (LO) generator 170 generates and provides transmit and receive LO signals to the mixers 138 and 156, respectively. A phase locked loop (PLL) 172 receives control information from the data processor 110 and provides control signals to the LO generator 170 to generate the transmit and receive LO signals at the proper frequencies.

FIG. 1 shows an exemplary transceiver design. In general, the conditioning of the signals in the transmitter 130 and the receiver 150 may be performed by one or more stages of amplifier, filter, mixer, etc. These circuits may be arranged differently from the configuration shown in FIG. 1. Furthermore, other circuits not shown in FIG. 1 may also be used in the transmitter and the receiver. For example, matching circuits may be used to match various active circuits in FIG. 1. Some circuits in FIG. 1 may also be omitted. The transceiver 120 may be implemented on one or more analog integrated circuits (ICs), radio frequency ICs (RFICs), mixed-signal ICs, etc. For example, the amplifier 132 through the power amplifier 144 in the transmitter 130 may be implemented on an RFIC. The driver amplifier 142 and the power amplifier 144 may also be implemented on another IC external to the RFIC.

The data processor 110 may perform various functions for the wireless communication device 100, e.g., processing for transmitted and received data. A memory 112 may store program codes and data for the data processor 110. The data processor 110 may be implemented on one or more application specific integrated circuits (ASICs) and/or other ICs.

As shown in FIG. 1, a transmitter and a receiver may include various amplifiers. Each amplifier at RF may have input impedance matching and output impedance matching, which are not shown in FIG. 1 for simplicity.

Capacitors are widely used in integrated circuits (e.g., analog integrated circuits). For example, the design of the transmitter and the receiver often includes differential circuits integrating metal-oxide-metal (MOM)/metal-insulator-metal (MIM)/metal-oxide-semiconductor (MOS) capacitors for alternating current coupling.

Figure 2:
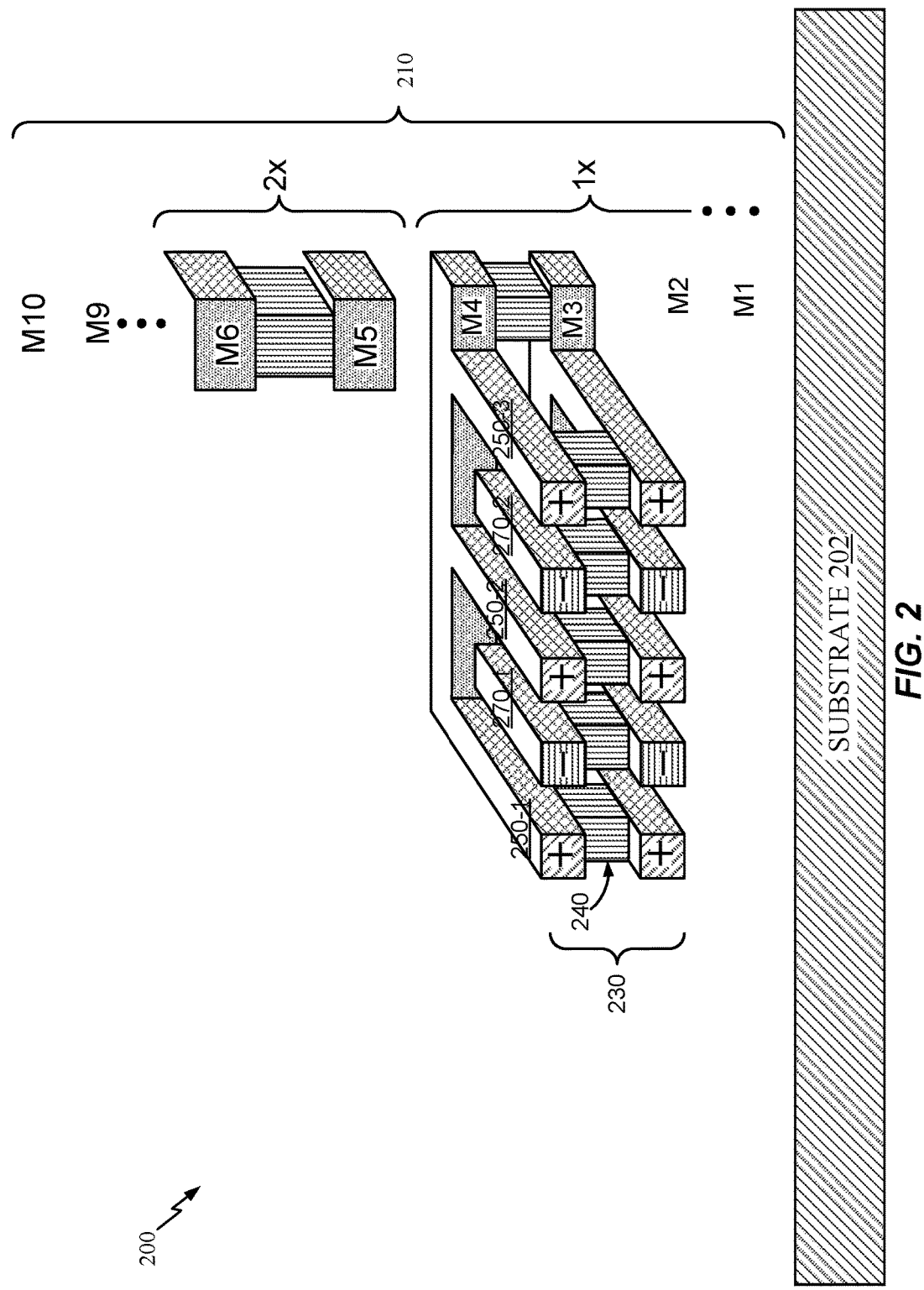
FIG. 2 is a cross-section illustrating an integrated circuit (IC) device including an interconnect stack that contains conventional metal-oxide-metal (MOM) capacitor structures.

FIG. 2 is a block diagram illustrating a cross-section of an analog integrated circuit (IC) device 200 including an interconnect stack 210. The interconnect stack 210 of the IC device 200 includes multiple conductive interconnect layers (M1, . . . , M9, M10) on a semiconductor substrate (e.g., a diced silicon wafer) 202. The semiconductor substrate 202 support a metal-oxide-metal (MOM) capacitor 230 and/or a metal-oxide-semiconductor (MOS) device. In this example, the MOM capacitor 230 is formed in the M3 and M4 interconnect layers, below the M5 and M6 interconnect layers. The MOM capacitor 230 is formed from lateral conductive fingers of different polarities using the conductive interconnect layers (M3 and M4) of the interconnect stack 210. A dielectric (not shown) is provided between the conductive fingers.

In this example, the MOM capacitor 230 is formed within the lower conductive interconnect layers (e.g., M1-M4) of the interconnect stack 210. The lower conductive interconnect layers of the interconnect stack 210 have smaller interconnect widths and spaces. For example, the dimensions of the conductive interconnect layers M3 and M4 are half the size of the dimensions of the conductive interconnect layers M5 and M6. Likewise, the dimensions of the conductive interconnect layers M1 and M2 are half the size of the dimensions of the conductive interconnect layers M3 and M4. The small interconnect widths and spaces of the lower conductive interconnect layers enable the formation of MOM capacitors with increased capacitance density.

As shown in FIG. 2, the MOM capacitor 230 makes use of a lateral (intra layer) capacitive coupling 240 between fingers (e.g., 250, 270) formed by standard metallization of the conductive interconnects (e.g., wiring lines and vias). The lateral coupling 240 within the MOM capacitor 230 provides improved matching characteristics when compared to the vertical coupling of parallel vertical plate capacitors.

Figure 3:
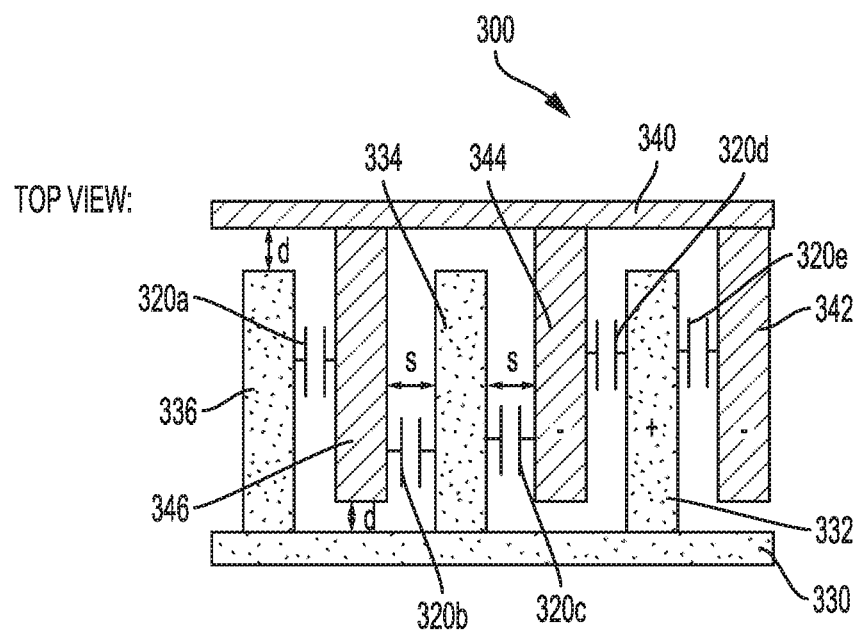
FIG. 3 illustrates a top view of a metal-oxide-metal (MOM) capacitor, according to aspects of the present disclosure.

FIG. 3 illustrates a top view of a metal-oxide-metal (MOM) capacitor 300, according to aspects of the present disclosure. The MOM capacitor 300 may be fabricated in one or more BEOL interconnect levels (e.g., M1-M4) such as the multiple conductive interconnect layers (M1, . . . , M9, M10).

The top view of the MOM capacitor 300 includes a first capacitor routing terminal (e.g., endcap or manifold) 330 and a second endcap 340. The first endcap 330 is parallel to the second endcap 340. The first endcap 330 is of a first polarity (e.g., positive) while the second endcap 340 is of a second polarity (e.g., negative). A first set of parallel conductive capacitor routing traces (e.g., conductive fingers) of the MOM capacitor 300 includes a first conductive finger 332, a second conductive finger 334, and a third conductive finger 336.

Each of the first conductive finger 332, the second conductive finger 334, and the third conductive finger 336 is orthogonally coupled to the first endcap 330. Each of the first conductive finger 332, the second conductive finger 334, and the third conductive finger 336 is of the first polarity.

A second set of parallel conductive fingers of the MOM capacitor 300 includes a fourth conductive finger 342, a fifth conductive finger 344, and a sixth conductive finger 346. Each of the fourth conductive finger 342, the fifth conductive finger 344, and the sixth conductive finger 346 is orthogonally coupled to the second endcap 340. Each of the fourth conductive finger 342, the fifth conductive finger 344, and the sixth conductive finger 346 is of the second polarity.

The first set of parallel conductive fingers are interdigitated with the second set of parallel conductive fingers at a first interconnect layer to form an array of capacitors 320 (including a first capacitor 320a, a second capacitor 320b, a third capacitor 320c, a fourth capacitor 320d, and a fifth capacitor 320e) between the conductive fingers of the first polarity and the conductive fingers of the second polarity. For example, the second capacitor 320b of the array of capacitors 320 is formed between the second conductive finger 334, which is a conductive finger of the first polarity and the sixth conductive finger 346, which is a conductive finger of the second polarity. The third capacitor 320c of the array of capacitors 320 is formed between the second conductive finger 334 and the fifth conductive finger 344.

The first endcap 330 is parallel to the second endcap 340 such that a first gap d separates the first set of parallel conductive fingers from the second endcap 340 and a second gap d separates the second set of parallel conductive fingers from the first endcap 330. The first set of parallel conductive fingers are interdigitated with the second set of parallel conductive fingers at a first interconnect layer such that a third gap S separates each of the first set of parallel conductive fingers from one or more adjacent second set of parallel conductive fingers.

Figure 4A:
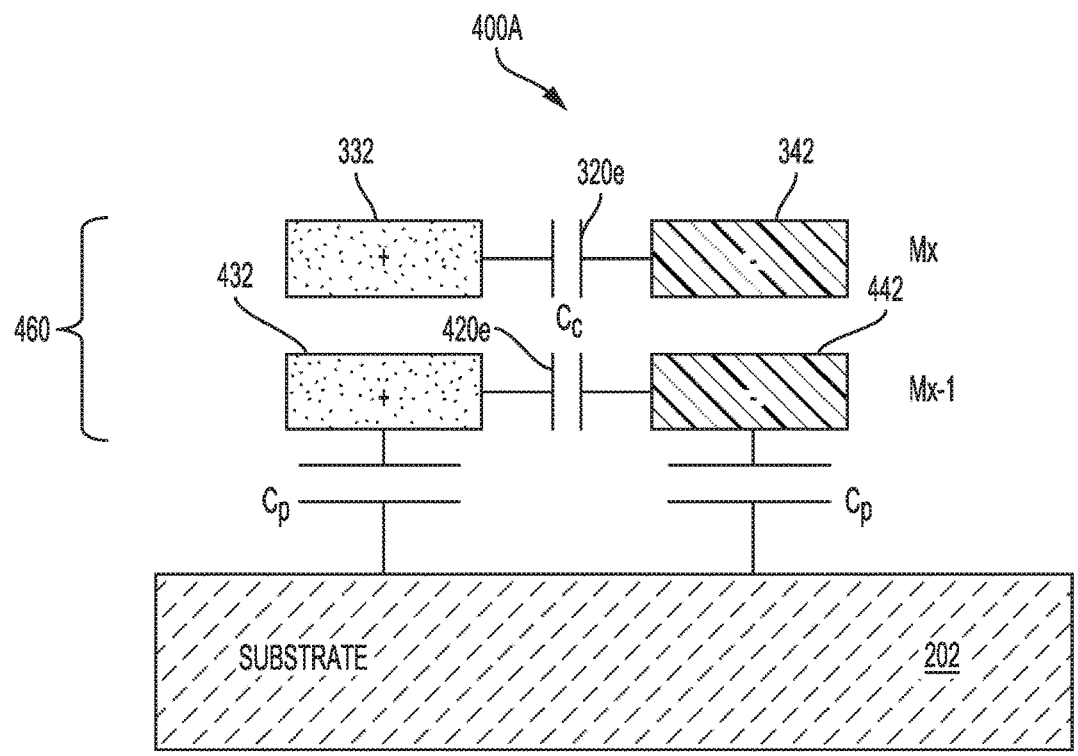
FIG. 4A is an example cross-sectional view of a semiconductor device that includes a capacitor (e.g., a metal-oxide-metal (MOM) capacitor) on a substrate illustrating parasitic capacitance that degrades performance of the capacitor.

FIG. 4A is an example cross-sectional view of a semiconductor device 400A that includes a capacitor 460 (e.g., a metal-oxide-metal (MOM) capacitor) on a substrate (e.g., the substrate 202 of FIG. 2) illustrating parasitic capacitances Cp, which degrades performance of the capacitor 460. For illustrative purposes, some of the labelling and numbering of the devices and features of FIG. 4A are similar to those of FIGS. 2 and 3. The cross-sectional view of the semiconductor device 400A includes multiple conductive interconnect layers (e.g., a first conductive interconnect layer Mx, a second conductive interconnect layer Mx−1, and/or subsequent conductive interconnect layers (not shown)).

The cross-sectional view of the semiconductor device 400A includes a first level of capacitor routing traces (e.g., the first conductive finger 332 and the fourth conductive finger 342) within the first conductive interconnect layer Mx. The cross-sectional view of the semiconductor device 400A also includes a second level of capacitor routing traces (e.g., a seventh conductive finger 432 and an eighth conductive finger 442) within the second conductive interconnect layer Mx−1. The first conductive finger 332 and the seventh conductive finger 432 are of the first polarity while the fourth conductive finger 342 and the eighth conductive finger 442 are of the second polarity.

The conductive fingers of the first polarity (e.g., the seventh conductive finger 432) in the second conductive interconnect layer Mx−1 are interdigitated with the conductive fingers of the second polarity (e.g., the eighth conductive finger 442) in the second conductive interconnect layer Mx−1. An array of desirable capacitances Cc (e.g., provided by the fifth capacitor 320e and the sixth capacitor 420e) are formed between the conductive fingers of the first polarity and the conductive fingers of the second polarity. For example, the sixth capacitor 420e of the array of capacitors Cc is formed between the seventh conductive finger 432 and the eighth conductive finger 442.

The first conductive interconnect layer Mx and the second conductive interconnect layer Mx−1 are on the semiconductor substrate 202. For example, the semiconductor substrate 202 supports the capacitor 460. Parasitic capacitance Cp formed between the capacitor 460 and the substrate 202 (e.g., silicon substrate) degrades performance of the capacitor 460. The parasitic capacitances are particularly detrimental in resonance circuits with inductors (e.g., inductor-capacitor circuits) where a tuning range is affected by the parasitic capacitance.

Figure 4B:
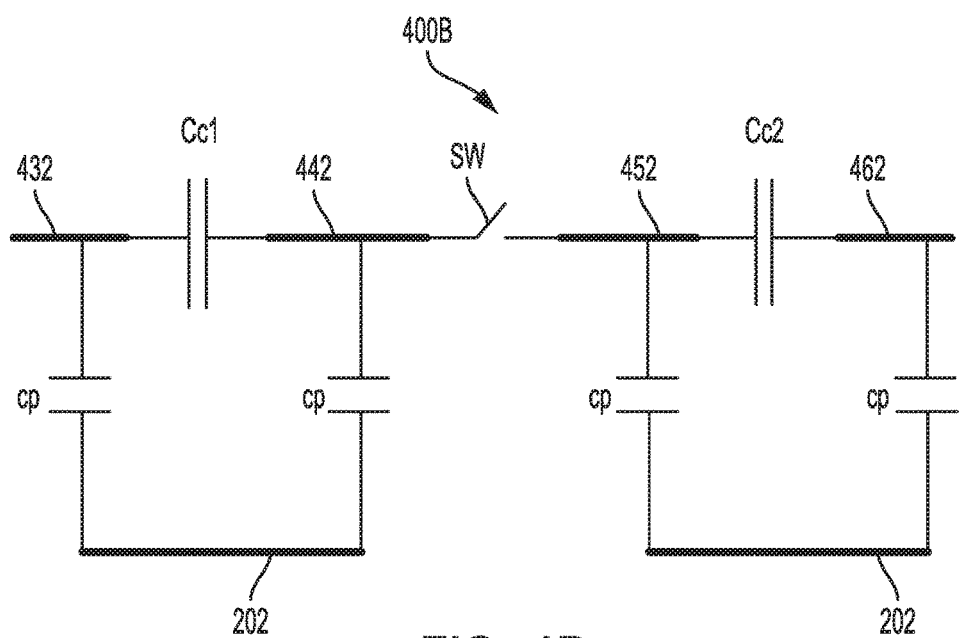
FIG. 4B illustrates a circuit representation of the semiconductor device of FIG. 4A.

FIG. 4B illustrates a circuit representation 400B of the semiconductor device 400A of FIG. 4A. The circuit representation 400B of the semiconductor device 400A may include an array of desirable capacitances Cc from one or more capacitors (e.g., MOM capacitors) coupled together by one or more switches SW. For example, a first capacitance Cc1 between a first set of conductive fingers (e.g., the seventh conductive finger 432 and the eighth conductive finger 442) may be selectively coupled to a second capacitance Cc2 between a second set of conductive fingers (e.g., a ninth conductive finger 452 and a tenth conductive finger 462) by one or more switches (e.g., switch SW). The one or more switches SW may increase or decrease the desirable capacitance for a specified application or mode of operation. For example, the capacitance can be increased or decreased during tuning of a resonance circuit with an inductor (e.g., an inductor-capacitor circuit (LC circuit)). The tuning range of the resonance circuit with the inductor, however, may be compromised by the presence of parasitic capacitances Cp between the capacitor and the substrate (e.g., the substrate 202).

For example, although the parasitic capacitance Cp is a small percentage (e.g., 1.5% or a few femto farads (fF)) of the desirable capacitance Cc (e.g., Cc1 and/or Cc2), the parasitic capacitance Cp accounts for a much larger portion of a total capacitance during tuning that degrades performance of the capacitor 460. The tuning can be implemented in a resonance circuit that includes the capacitor 460 and one or more inductors (not shown) that generate an inductance (L). For example, when the switch is ON, a resonant frequency $f_L$ is as follows:

$$f_L = 1/\text{sqrt}(LCc/2),$$

where $f_L$ is a resonant frequency when the switch is ON; sqrt is a square root; L is inductance of a resonance circuit; and Cc is capacitance of the resonance circuit (e.g., Cc1=Cc2=Cc and the total capacitance is given by Cc/2).

Thus, when the switch SW is ON, a total capacitance of the circuit representation 400B of the semiconductor device 400A is Cc/2.

However, when the switch SW is OFF, the total capacitance of the circuit representation 400B of the semiconductor device 400A is equal to the parasitic capacitance Cp and a resonant frequency $f_h$ is as follows:

$$f_h = 1/\text{sqrt}(LCp).$$

When the capacitor 460 is used in a resonance circuit with the inductor, a tuning range is determined by the parasitic capacitance Cp. Thus, if the parasitic capacitance Cp can be reduced (e.g., by a quarter or a few femto farads), the tuning range can be doubled. The tuning range is a ratio of the resonant frequency $f_h$ to the resonant frequency $f_L$.

Figure 5:
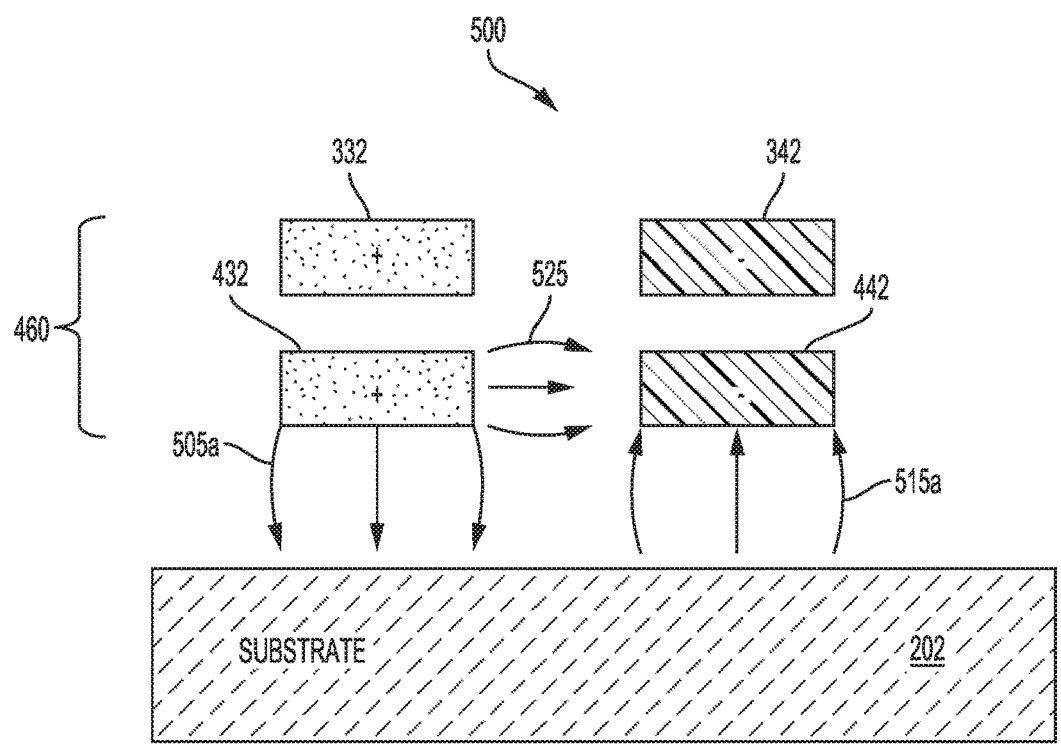
FIG. 5 illustrates an electric field distribution of a semiconductor device including a capacitor and a substrate.

FIG. 5 illustrates an electric field distribution of a semiconductor device 500 including a capacitor (e.g., the capacitor 460) and a substrate (e.g., the substrate 202). For illustrative purposes, some of the labelling and numbering of the devices and features of FIG. 5 are similar to those of FIGS. 2, 3, and 4A. Desired capacitance exists between the seventh conductive finger 432 and the eighth conductive finger 442. The desired capacitance creates an electric field (e.g., illustrated with electric field lines 525) between the seventh conductive finger 432 and the eighth conductive finger 442. Parasitic capacitance Cp exists between the substrate and each of the seventh conductive finger 432 and the eighth conductive finger 442. The parasitic capacitance creates an electric field (e.g., illustrated with electric field lines 505a and 515a) between the substrate 202 and each of the seventh conductive finger 432 and the eighth conductive finger 442. A dielectric material (not shown) may be included between the semiconductor substrate 202 and each of the seventh conductive finger 432 and the eighth conductive finger 442. The dielectric material may also be included between the conductive fingers of the capacitor 460. For example, the dielectric material is between the seventh conductive finger 432 and the eighth conductive finger 442.

Figure 6:
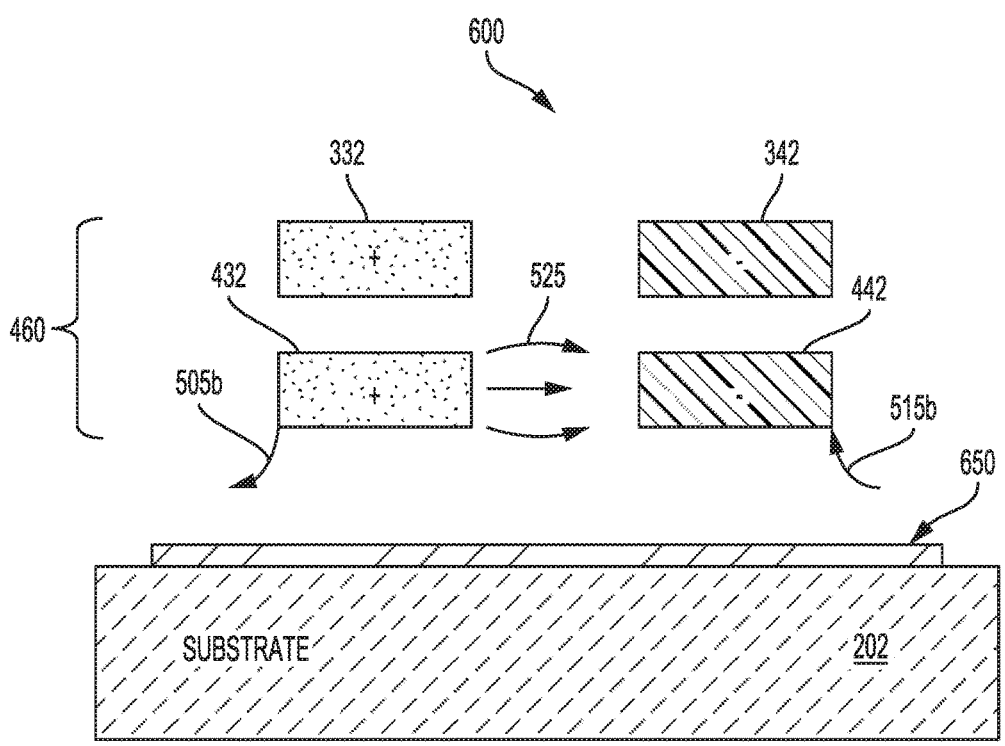
FIG. 6 illustrates a semiconductor device that reduces parasitic capacitance between a capacitor and a semiconductor substrate, according to aspects of the present disclosure.

Aspects of the present disclosure are directed to a semiconductor device that reduces parasitic capacitance between the capacitors and the semiconductor substrate, as illustrated in FIG. 6.

FIG. 6 illustrates a semiconductor device 600 that reduces parasitic capacitance between a capacitor (e.g., the capacitor 460) and a semiconductor substrate (e.g., the semiconductor substrate 202), according to aspects of the present disclosure. For illustrative purposes, some of the labelling and numbering of the devices and features of FIG. 6 are similar to those of FIGS. 2, 3, 4A, and 5.

The semiconductor device 600 includes the semiconductor substrate 202, a magnetic material layer 650, and a capacitor (e.g., the capacitor 460). The magnetic material layer 650 is between the semiconductor substrate 202 and the capacitor 460. In one aspect, a dielectric material (not shown) may be disposed between the magnetic material layer 650 and the capacitor 460. In one aspect of the present disclosure, the magnetic material layer 650 directly contacts the capacitor 460. For example, the magnetic material layer 650 directly contacts the seventh conductive finger 432 and the eighth conductive finger 442. In some aspects, the magnetic material layer 650 is on the substrate 202 while the capacitor 460 is above the magnetic material layer 650.

The magnetic material layer 650 has high permeability µ (at least ten (10) Henries/meter (H/m), and possibly between 30 and 1000 H/m) and alters an electric field distribution of the semiconductor device 600. For example, the magnetic material layer 650 generates a magnetic field that repels charge associated with the capacitor 460 and the substrate 202 to mitigate (e.g., reduce) parasitic capacitance between a conductive element (e.g., the seventh conductive finger 432 and the eighth conductive finger 442) of the capacitor 460 and the semiconductor substrate 202. The repulsion is illustrated by the electric field lines 505b and 515b, which are reduced as well as diverted/repelled relative to the electric field lines 505a and 515a of FIG. 5. The magnetic material layer 650 may include a material such as a ferrite or a soft ferromagnetic material. The soft ferromagnetic material may include perm alloy, cobalt-iron (CoFe), cobalt zirconium tantalum (CoZrTa) or cobalt niobium zirconium (CoNbZr).

Figure 7:
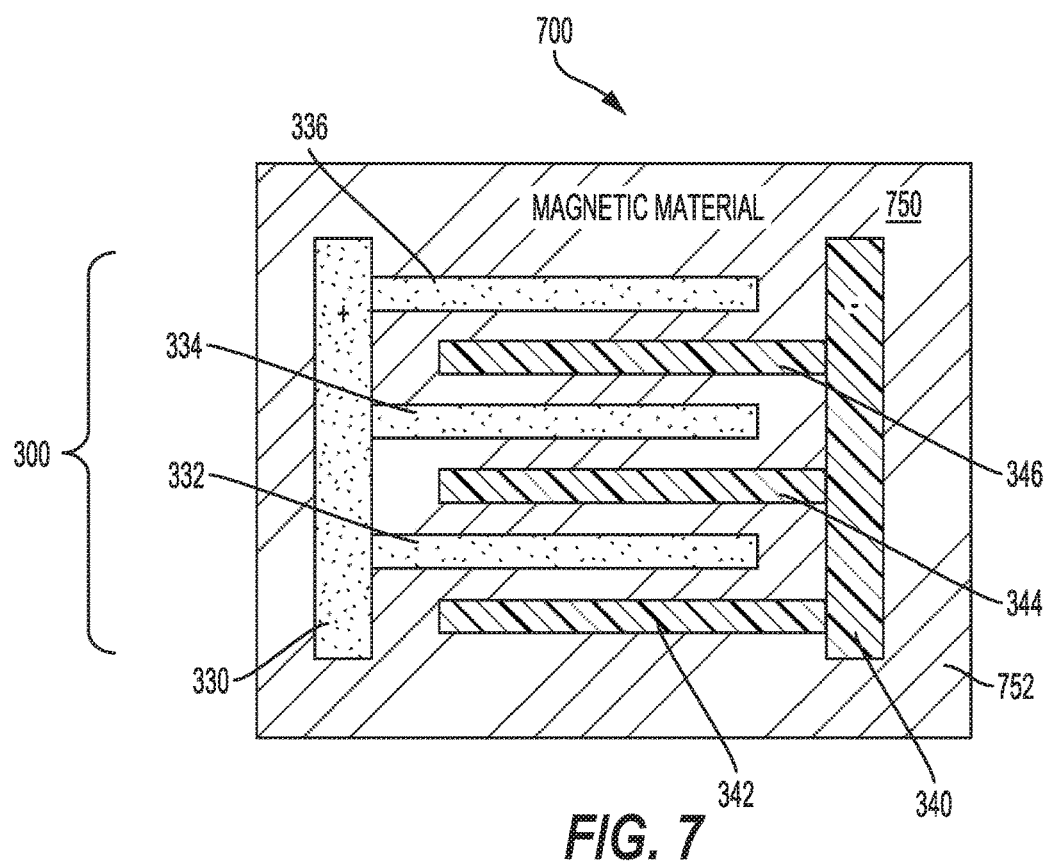
FIG. 7 illustrates a semiconductor device that reduces parasitic capacitance between a capacitor and a semiconductor substrate, according to aspects of the present disclosure.

FIG. 7 illustrates a semiconductor device 700 that reduces parasitic capacitance between a capacitor (e.g., the MOM capacitor 300) and a semiconductor substrate (e.g., the semiconductor substrate 202 (not shown)), according to aspects of the present disclosure. The semiconductor device 700 includes a magnetic material layer 750 with a footprint that is greater than or equal to a footprint of the MOM capacitor 300. For example, the magnetic material layer 750 includes a first surface (not shown) on a substrate (e.g., the substrate 202) and a second surface 752 opposite the first surface. As illustrated in FIG. 7, a perimeter of the MOM capacitor 300 is within a perimeter of the second surface 752 of the magnetic material layer 750 or the perimeter of the MOM capacitor 300 is equal to the perimeter of the second surface 752. Alternatively, one or more portions of a surface area of the MOM capacitor 300 overlaps the perimeter of the second surface 752 of the magnetic material layer 750.

Figure 8:
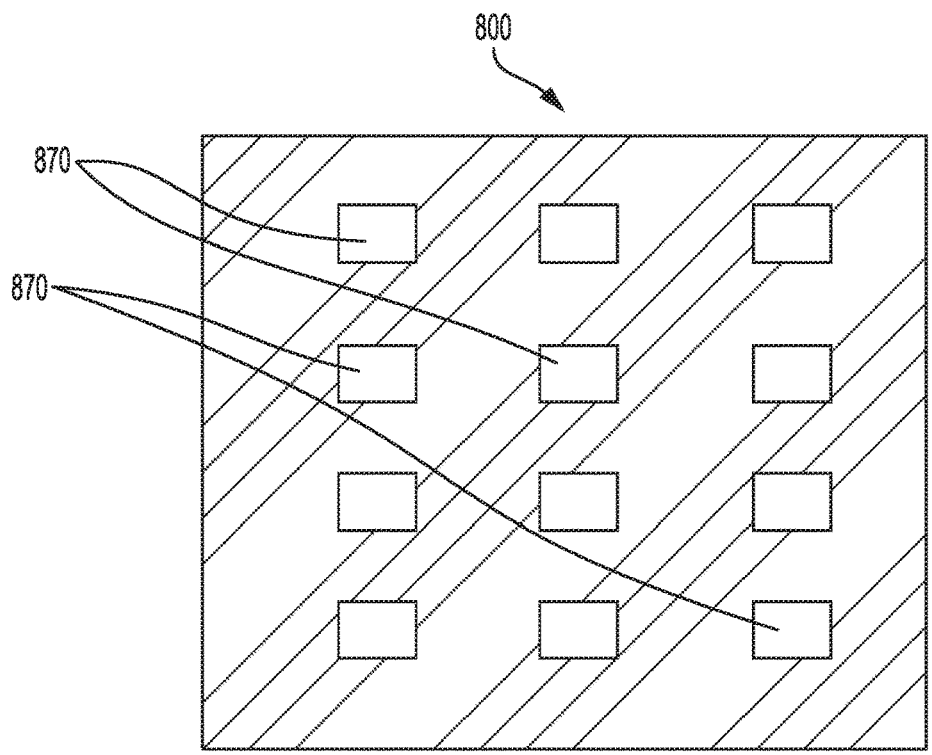
FIG. 8 illustrates a magnetic material layer, according to some aspects of the present disclosure.

FIG. 8 illustrates a magnetic material layer 800, according to some aspects of the present disclosure. The magnetic material layer 800 includes one or more gaps 870. The one or more gaps 870 may define openings through which the one or more active/passive devices of a semiconductor device can be accessed. For example, one or more gaps 870 define openings through which terminals of active devices (e.g., gates, drains, and/or sources) fabricated on the substrate 202 (not shown) can be accessed.

Figure 9:
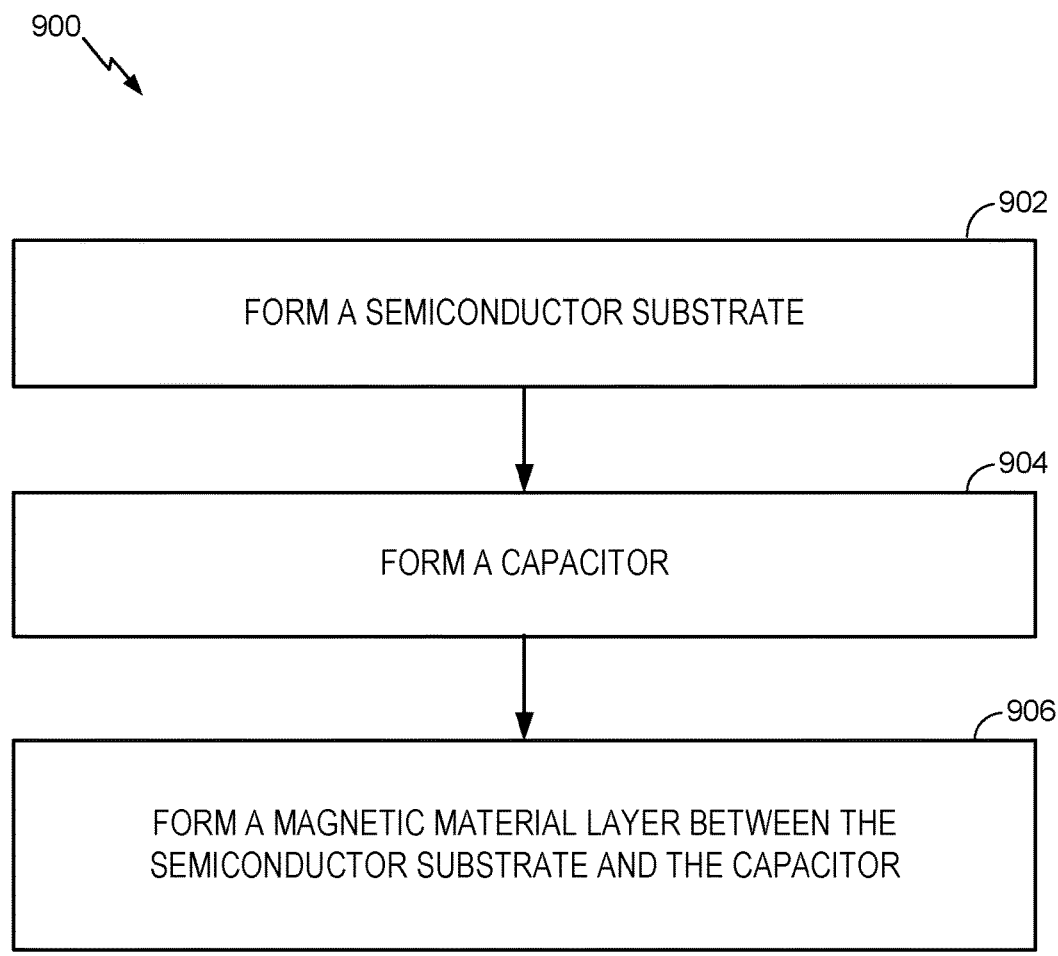
FIG. 9 is a process flow diagram illustrating a method for fabricating a semiconductor device, according to an aspect of the present disclosure.

FIG. 9 is a process flow diagram illustrating a method 900 for fabricating a semiconductor device, according to an aspect of the present disclosure. In block 902, a semiconductor substrate is formed. In block 904, a capacitor is formed. In block 906, a magnetic material layer is formed between the semiconductor substrate and the capacitor.

According to a further aspect of the present disclosure, a semiconductor device includes means for generating a magnetic field to mitigate parasitic capacitance formed between the capacitor and the semiconductor substrate. The magnetic field generating means is between the semiconductor substrate and the capacitor. In one configuration, the magnetic field generating means includes the magnetic material layer 650 and/or the magnetic material layer 750. In another aspect, the aforementioned means may be any structure or any material configured to perform the functions recited by the aforementioned means.

Figure 10:
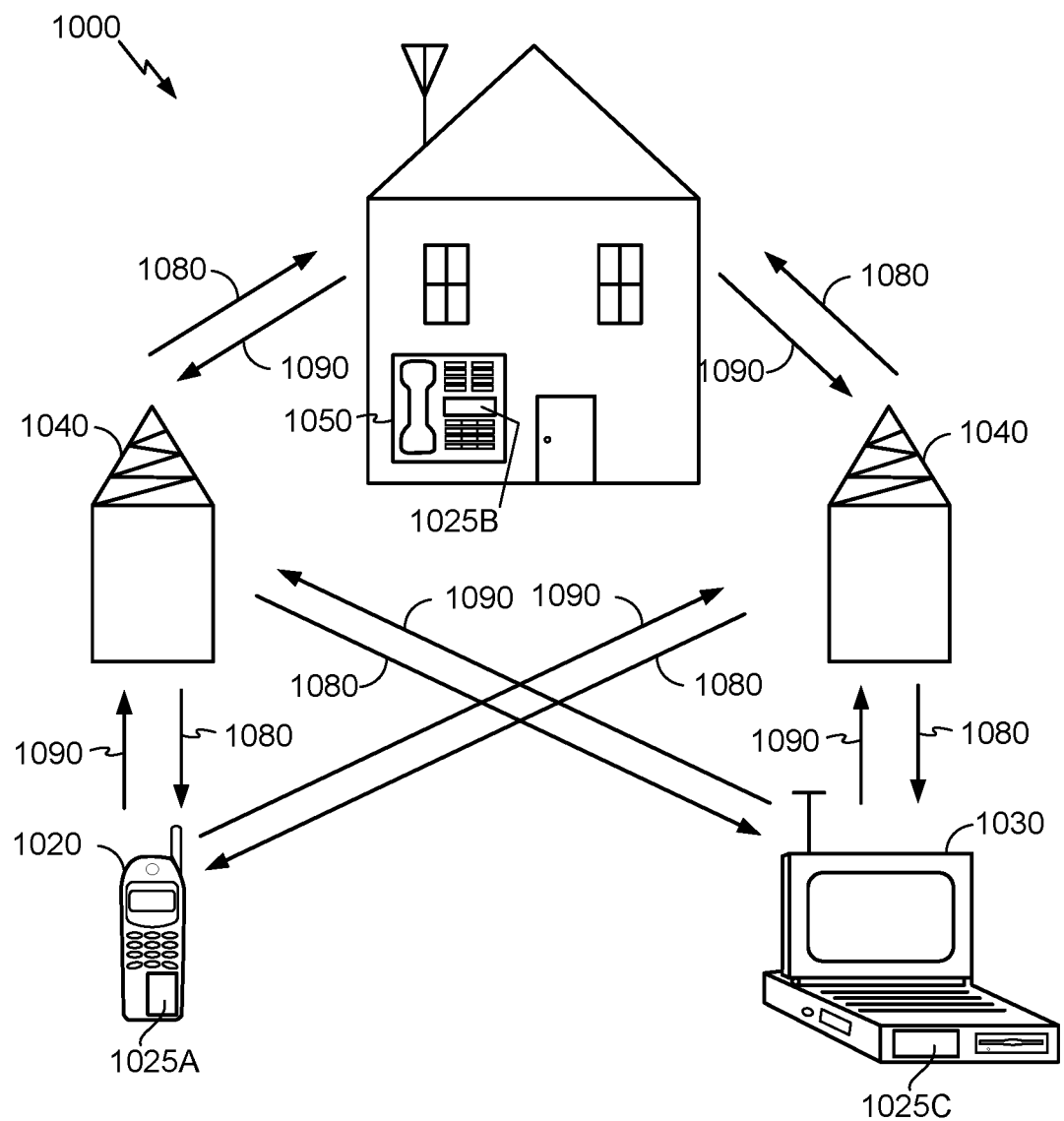
FIG. 10 is a block diagram showing an exemplary wireless communication system in which a configuration of the present disclosure may be advantageously employed.

FIG. 10 is a block diagram showing an exemplary wireless communication system 1000 in which an aspect of the present disclosure may be advantageously employed. For purposes of illustration, FIG. 10 shows three remote units 1020, 1030, and 1050 and two base stations 1040. It will be recognized that wireless communication systems may have many more remote units and base stations. Remote units 1020, 1030, and 1050 include IC devices 1025A, 1025C, and 1025B that include the disclosed semiconductor device. It will be recognized that other devices may also include the disclosed semiconductor device, such as the base stations, switching devices, and network equipment. FIG. 10 shows forward link signals 1080 from the base station 1040 to the remote units 1020, 1030, and 1050 and reverse link signals 1090 from the remote units 1020, 1030, and 1050 to base stations 1040.

In FIG. 10, remote unit 1020 is shown as a mobile telephone, remote unit 1030 is shown as a portable computer, and remote unit 1050 is shown as a fixed location remote unit in a wireless local loop system. For example, the remote units may be a mobile phone, a hand-held personal communication systems (PCS) unit, a portable data unit, such as a personal data assistant, a GPS enabled device, a navigation device, a set top box, a music player, a video player, an entertainment unit, a fixed location data unit, such as a meter reading equipment, or other device that stores or retrieves data or computer instructions, or combinations thereof. Although FIG. 10 illustrates remote units, according to the aspects of the present disclosure, the present disclosure is not limited to these exemplary illustrated units. Aspects of the present disclosure may be suitably employed in many devices, which include the disclosed semiconductor device.

Figure 11:
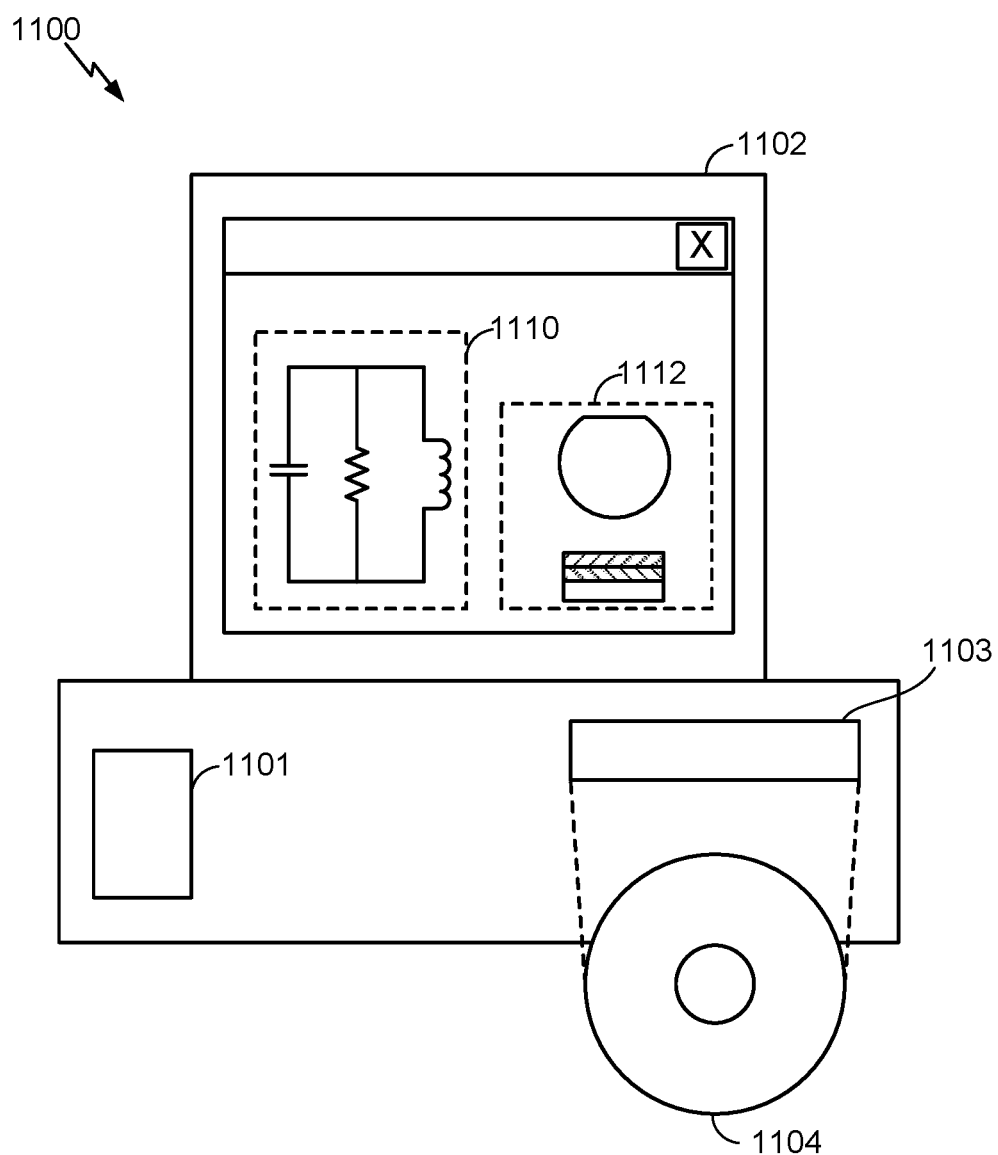
FIG. 11 is a block diagram illustrating a design workstation used for circuit, layout, and logic design of a semiconductor component, according to one configuration.

FIG. 11 is a block diagram illustrating a design workstation used for circuit, layout, and logic design of a semiconductor component, such as the semiconductor devices disclosed above. A design workstation 1100 includes a hard disk 1101 containing operating system software, support files, and design software such as Cadence or OrCAD. The design workstation 1100 also includes a display 1102 to facilitate design of a circuit 1110 or an RF component 1112 such as the semiconductor device. A storage medium 1104 is provided for tangibly storing the design of the circuit 1110 or the RF component 1112 (e.g., the semiconductor device). The design of the circuit 1110 or the RF component 1112 may be stored on the storage medium 1104 in a file format such as GDSII or GERBER. The storage medium 1104 may be a CD-ROM, DVD, hard disk, flash memory, or other appropriate device. Furthermore, the design workstation 1100 includes a drive apparatus 1103 for accepting input from or writing output to the storage medium 1104.

Data recorded on the storage medium 1104 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 1104 facilitates the design of the circuit 1110 or the RF component 1112 by decreasing the number of processes for designing semiconductor wafers.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions, and alterations can be made herein without departing from the technology of the present disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, composition of matter, means, methods, and steps described in the specification. As one of ordinary skill in the art will readily appreciate from the present disclosure, processes, machines, manufacture, compositions of matter, means, methods, or steps, presently existing or later to be developed that perform substantially the same function or achieve substantially the same result as the corresponding configurations described herein may be utilized, according to the present disclosure. Accordingly, the appended claims are intended to include within their scope such processes, machines, manufacture, compositions of matter, means, methods, or steps.

Those of skill would further appreciate that the various illustrative logical blocks, modules, circuits, and algorithm steps described in connection with the present disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the present disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, multiple microprocessors, one or more microprocessors in conjunction with a DSP core, or any other such configuration.

The steps of a method or algorithm described in connection with the present disclosure may be embodied directly in hardware, in a software module executed by a processor, or in a combination of the two. A software module may reside in RAM, flash memory, ROM, EPROM, EEPROM, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can include RAM, ROM, EEPROM, CD-ROM or other optical disk storage, magnetic disk storage or other magnetic storage devices, or any other medium that can be used to carry or store specified program code means in the form of instructions or data structures and that can be accessed by a general-purpose or special-purpose computer, or a general-purpose or special-purpose processor. In addition, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk, and Blu-ray disc where disks usually reproduce data magnetically, while discs reproduce data optically with lasers. Combinations of the above should also be included within the scope of computer-readable media.

The previous description of the present disclosure is provided to enable any person skilled in the art to make or use the present disclosure. Various modifications to the present disclosure will be readily apparent to those skilled in the art, and the generic principles defined herein may be applied to other variations without departing from the spirit or scope of the present disclosure. Thus, the present disclosure is not intended to be limited to the examples and designs described herein but is to be accorded the widest scope consistent with the principles and novel features disclosed herein.

What is claimed is:

1. A semiconductor device, comprising:
   a semiconductor substrate;
   a capacitor; and
   a magnetic material layer between the semiconductor substrate and the capacitor in which the magnetic material layer includes a first surface on the semiconductor substrate and a second surface opposite the first surface, in which a perimeter of the capacitor is within a perimeter of the second surface of the magnetic material layer.

2. The semiconductor device of claim 1, in which the magnetic material layer has a permeability of at least ten (10) Henries/meter (H/m).

3. The semiconductor device of claim 1, in which the magnetic material layer comprises ferrite or a soft ferromagnetic material.

4. The semiconductor device of claim 3, in which the soft ferromagnetic material comprises permalloy, cobalt-iron (CoFe), cobalt zirconium tantalum (CoZrTa), or cobalt niobium zirconium (CoNbZr).

5. The semiconductor device of claim 1, in which a dielectric material is between the magnetic material layer and the capacitor.

6. The semiconductor device of claim 1, in which the magnetic material layer directly contacts the capacitor.

7. The semiconductor device of claim 1, in which the semiconductor substrate comprises a silicon substrate, a silicon on insulator (SOI) substrate, or a III-V compound semiconductor substrate.

8. A method of making a semiconductor device, comprising:
   forming a semiconductor substrate;
   forming a capacitor; and
   forming a magnetic material layer between the semiconductor substrate and the capacitor, in which forming the magnetic material layer comprises forming the magnetic material layer with a first surface on the semiconductor substrate and a second surface opposite the first surface, in which a perimeter of the capacitor is within a perimeter of the second surface of the magnetic material layer.

9. The method of claim 8, in which forming the magnetic material layer comprises forming the magnetic material layer having a permeability of at least ten (10) Henries/meter (H/m).

10. The method of claim 8, in which forming the magnetic material layer comprises forming the magnetic material layer comprising ferrite or a soft ferromagnetic material.

11. The method of claim 10, in which the soft ferromagnetic material comprises permalloy, cobalt-iron (CoFe), cobalt zirconium tantalum (CoZrTa), or cobalt niobium zirconium (CoNbZr).

12. A radio frequency (RF) front end module comprising:
   a semiconductor device having a semiconductor substrate, a capacitor, and a magnetic material layer between the semiconductor substrate and the capacitor, in which the magnetic material layer includes a first surface on the semiconductor substrate and a second surface opposite the first surface, in which a perimeter of the capacitor is within a perimeter of the second surface of the magnetic material layer; and
   an antenna coupled to the semiconductor device.

13. The radio frequency front end module of claim 12, in which the magnetic material layer has a permeability of at least ten (10) Henries/meter (H/m).

14. The radio frequency front end module of claim 12, in which the magnetic material layer comprises ferrite or a soft ferromagnetic material.

15. The radio frequency front end module of claim 14, in which the soft ferromagnetic material comprises permalloy, cobalt-iron (CoFe), cobalt zirconium tantalum (CoZrTa), or cobalt niobium zirconium (CoNbZr).

\* \* \* \* \*